United States Patent
Hara et al.

(10) Patent No.: US 6,836,531 B2
(45) Date of Patent: Dec. 28, 2004

(54) X-RAY PROJECTION EXPOSURE APPARATUS AND A DEVICE MANUFACTURING METHOD

(75) Inventors: Shinichi Hara, Kitasaitama-gun (JP); Masami Tsukamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/679,278

(22) Filed: Oct. 7, 2003

(65) Prior Publication Data

US 2004/0071260 A1 Apr. 15, 2004

Related U.S. Application Data

(62) Division of application No. 09/948,041, filed on Sep. 7, 2001, now Pat. No. 6,668,037, which is a continuation of application No. 09/342,897, filed on Jun. 29, 1999, now Pat. No. 6,310,934, which is a division of application No. 08/813,349, filed on Mar. 7, 1997, now Pat. No. 6,084,938.

(30) Foreign Application Priority Data

Mar. 12, 1996 (JP) ............................................. 7/054636
Feb. 18, 1997 (JP) ............................................. 8/033869

(51) Int. Cl.⁷ ................................................. G21K 5/00
(52) U.S. Cl. ................................................... 378/34
(58) Field of Search ............................................ 378/34

(56) References Cited

U.S. PATENT DOCUMENTS

| | | | |
|---|---|---|---|
| 4,969,168 A | 11/1990 | Sakamoto et al. | 378/34 |
| 5,003,567 A | 3/1991 | Hawryluk et al. | 378/34 |
| 5,052,033 A | 9/1991 | Ikeda et al. | 378/35 |
| 5,063,582 A | 11/1991 | Mori et al. | 378/34 |
| 5,093,579 A | 3/1992 | Amemiya et al. | 250/453.1 |
| 5,153,898 A | 10/1992 | Suzuki et al. | 378/34 |
| 5,155,523 A | 10/1992 | Hara et al. | 355/53 |
| 5,220,171 A | 6/1993 | Hara et al. | 250/443.1 |
| 5,222,112 A | 6/1993 | Terasawa et al. | 378/34 |
| 5,323,440 A | 6/1994 | Hara et al. | 378/34 |
| 5,413,167 A | 5/1995 | Hara et al. | 165/86 |
| 5,485,495 A | 1/1996 | Miyachi et al. | 378/34 |
| 5,544,213 A | 8/1996 | Chiba et al. | 378/34 |
| 5,593,800 A | 1/1997 | Fujioka et al. | 430/5 |
| 5,608,773 A | 3/1997 | Korenaga et al. | 378/34 |
| 5,825,463 A | 10/1998 | Hara et al. | 355/75 |
| 5,854,819 A | 12/1998 | Hara et al. | 378/34 |
| 5,883,932 A | 3/1999 | Chiba et al. | 378/34 |
| 5,889,758 A | 3/1999 | Maehara et al. | 378/35 |
| 6,005,910 A | 12/1999 | Chiba et al. | 378/34 |
| 6,038,279 A | 3/2000 | Miyake et al. | 378/34 |
| 6,084,938 A | 7/2000 | Hara et al. | 378/34 |
| 6,310,934 B1 | 10/2001 | Hara et al. | 378/34 |

FOREIGN PATENT DOCUMENTS

| | | |
|---|---|---|
| JP | 2-100311 | 4/1990 |
| JP | 5-21308 | 1/1993 |

*Primary Examiner*—Craig E. Church
(74) *Attorney, Agent, or Firm*—Fitzpatrick, Cella, Harper & Scinto

(57) ABSTRACT

An exposure apparatus includes a chuck for holding an object and an optical system for directing light from a light source to the object held by the chuck. The optical system includes a multilayer film mirror which has a concave reflecting surface, wherein an area of contacting portions of the chuck is set so that the contact portions area of the chuck is at most 10% of an area of the object held by the chuck.

6 Claims, 6 Drawing Sheets

WAFER PROCESS

X-RAY PROJECTION EXPOSURE APPARATUS AND A DEVICE MANUFACTURING METHOD

This application is a divisional application of U.S. patent application Ser. No. 09/948,041, filed Sep. 7, 2001, now U.S. Pat. No. 6,668,037 which is a continuation application of U.S. patent application Ser. No. 09/342,897, filed Jun. 29, 1999, now U.S. Pat. No. 6,310,934, issued Oct. 30, 2001, which is a divisional application of U.S. patent application Ser. No. 08/813,349, filed Mar. 7, 1997, now U.S. Pat. No. 6,084,938, issued Jul. 4, 2000.

BACKGROUND OF THE INVENTION

1. Field of the Invention

This invention relates to an X-ray projection exposure apparatus used in the manufacture of semiconductor integrated circuits.

2. Description of the Related Art

In solid-state devices, such as LSIs (large-scale integrated circuits) and the like, circuit patterns are becoming finer in order to increase the degree of integration and the operation speed thereof. In order to form such fine circuit patterns, reduction projection exposure apparatuses having vacuum-ultraviolet exposure light sources are widely used. The resolution of such a reduction projection exposure apparatus depends on the exposure wavelength $\lambda$ and the numerical aperture NA of the projection optical system. In conventional exposure apparatuses, an approach of increasing the numerical aperture NA is adopted in order to improve the resolution.

However, this approach is now close to the limit of the use because of the resulting reduction in the depth of focus and difficulty in the design and the manufacturing of the dioptric system. Accordingly, an attempt to shorten the exposure wavelength $\lambda$ is being made. For example, light used for exposure shifts from the g-line ($\lambda$=435.8 nm) to the i-line ($\lambda$=365 nm) of the mercury lamp, and further to KrF excimer lasers ($\lambda$=258 nm).

Although the resolution of the apparatus is improved by shortening the exposure wavelength, there is a theoretical limit on the resolution from the wavelength of ultraviolet rays used for exposure. Accordingly, in the extended technique of conventional exposure apparatuses using light, it is difficult to obtain a resolution equal to or less than 0.1 um.

Against such a technical background, X-ray reduction projection exposure apparatuses using vacuum-ultraviolet rays or soft X-rays (these two kinds of rays are hereinafter termed "X-rays") as exposure light are attracting notice.

SUMMARY OF THE INVENTION

It is an object of the present invention to provide a practical X-ray projection exposure apparatus in which the above-described problems are solved.

It is another object of the present invention to provide a device manufacturing method having a high productivity using such an exposure apparatus.

According to one aspect, the present invention provides an X-ray projection exposure apparatus comprising a mask chuck for holding a reflection X-ray mask having a mask pattern thereon, a wafer chuck for holding a wafer onto which the mask pattern is transferred, an X-ray illuminating system for illuminating the reflection X-ray mask, held by the mask chuck, with X-rays, and an X-ray projection optical system for projecting the mask pattern of the reflection X-ray mask onto the wafer held by the wafer chuck with a predetermined magnification. The mask chuck comprises a mechanism for generating static electricity for attracting and holding the reflection X-ray mask by an electrostatic force.

It is preferable that the apparatus further comprises a detection mechanism for detecting an attracting force when attracting and holding the mask on the mask chuck. For example, the detection mechanism comprises a pressure sensor provided on an attracting surface of the mask chuck. It is preferable that the apparatus further comprises means for performing scanning exposure by moving both of the mask chuck and the wafer chuck. For example, the mask chuck holds the mask against gravity.

It is preferable that the apparatus further comprises means for changing the electrostatic force for attracting the mask by the mask chuck in accordance with the movement of the mask chuck. It is preferable that the relationship of {(the mass of the mask)×(acceleration due to gravity+the maximum acceleration of the mask while being moved)/(the maximum coefficient of static friction between the mask and the mask chuck)}×(safety factor)<(the attracting force of the mask) is satisfied.

It is preferable that a plurality of projections are formed on a mask holding surface of the mask chuck, and the reflection X-ray mask is supported by the plurality of projections. The ratio of the area of contact between the distal ends of the projections and the mask to the entire area of the mask is equal to or less than 10%. It is preferable that the apparatus further comprises means for supplying voids formed between the projections with a cooling gas when the mask is supported on the projections. It is also preferable that the apparatus further comprises a temperature control mechanism for controlling the temperature of the mask chuck. For example, the temperature control mechanism comprises means for supplying the inside of the mask chuck with a temperature controlled medium, and a temperature sensor for detecting the temperature of the mask chuck. It is preferable that the mask chuck comprises a ceramic material or a glass material. It is also preferable that the apparatus further comprises a grounded earth pawl provided at at least a side of the mask chuck for supporting the mask.

For example, the reflection X-ray mask has a structure in which the mask pattern, made of an absorbing member, is formed on an X-ray reflecting multilayer film. For example, the X-ray illuminating system comprises a radiation source and a reflecting mirror. For example, the X-ray projection optical system comprises a reduction projection optical system having a plurality of X-ray-reflecting mirrors.

According to another aspect, the present invention provides a device manufacturing method comprising the step of transferring a mask pattern onto a wafer using the X-ray projection exposure apparatus having the above-described configuration.

According to still another aspect, the present invention relates to a device manufacturing method using an X-ray projection exposure apparatus comprising a mask chuck, a wafer chuck, an X-ray illuminating system, and an X-ray projection optical system. The mask chuck holds a reflection X-ray mask having a mask pattern thereon. The wafer chuck holds the wafer onto which the mask pattern is transferred. The X-ray illuminating system illuminates the reflection X-ray mask, held on the mask chuck, with X-rays. The X-ray projection exposure system projects the mask pattern of the reflection X-ray mask onto the wafer held by the wafer chuck with a predetermined magnification. The mask chuck comprises a mechanism for generating static electricity for attracting and holding the reflection X-ray mask by an electrostatic force. The method comprises the steps of generating static electricity with the mechanism of the mask chuck to hold the reflection X-ray mask with the mask chuck by an electrostatic force, holding the wafer with the wafer chuck, illuminating the reflection X-ray mask with X-rays using the X-ray illuminating system, and projecting the mask pattern of the reflection X-ray mask onto the wafer held by the wafer chuck with a predetermined magnification with the X-ray projection optical system to transfer the mask pattern onto the wafer.

The foregoing and other objects, advantages and features of the present invention will become more apparent from the following description of the preferred embodiments taken in conjunction with the accompanying drawings.

BRIEF DESCRIPTION OF THE DRAWINGS

FIG. 2(a) is a perspective view; and FIG. 2(b) is a cross-sectional view as seen from a side;

DESCRIPTION OF THE PREFERRED EMBODIMENTS

Figure 4:
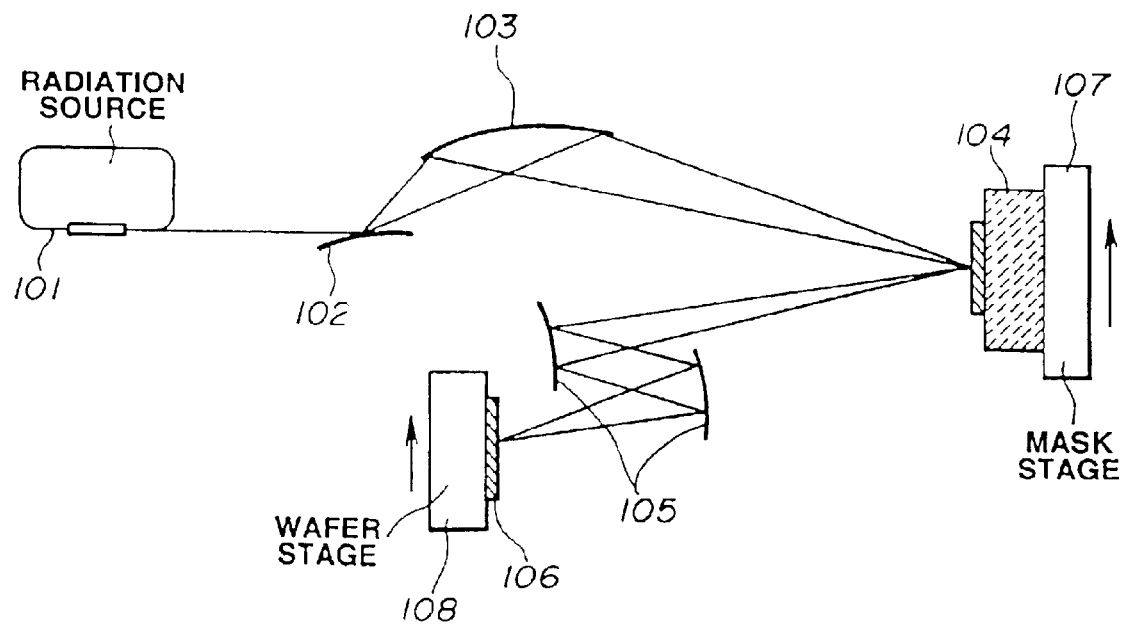
FIG. 4 is a schematic diagram illustrating the entire configuration of an X-ray reduction projection exposure apparatus.

FIG. 4 is a diagram illustrating the entire configuration of an X-ray reduction projection exposure apparatus.

In FIG. 4, X-rays (vacuum-ultraviolet rays or soft X-rays) are emitted from an undulator source 101, serving as a radiation source. The optical path of the X-rays is deflected by an illuminating system comprising a convex total-reflection mirror 102 and a concave multilayer-film reflecting mirror 103, and the X-rays are then projected onto a reflection mask 104. A multilayer film for effecting regular reflection of X-rays is formed on the reflection mask 104, and a predetermined circuit pattern is formed on the multilayer film.

The X-rays reflected by the reflection mask 104 reach a wafer 106 after passing through a reduction projection optical system 105 having a plurality of reflection mirrors, to image the circuit pattern on the wafer 106 with a predetermined projection magnification (for example, ⅕).

The reflection mask 104 is fixed and held on a mask stage 107, and the wafer 106 is fixed and held on a wafer stage 108. The reflection mask 104 and the wafer 106 are aligned with each other by the mask stage 107 and the wafer stage 108, respectively, and the scanning movement of the mask stage 107 holding the reflection mask 104 and the wafer stage 108 holding the wafer 106 is performed in a synchronized manner.

Since the wavelength of the X-rays used for exposure is between about 20 nm and 4 nm, the theoretical resolution determined by the wavelength of the exposure light is improved.

Since vacuum-ultraviolet rays and soft X-rays are greatly attenuated by a gas, the inside of the entire apparatus is held in a vacuum or in a reduced pressure of a light-element gas, such as helium or the like.

In the present invention, an electrostatic chuck (unipolar type) which is suitable for the use in a vacuum or in a reduced pressure is used for a mechanism for fixing and holding the reflection mask 104 on the mask stage 107. The electrostatic chuck functions based on the principle that charges having a sign opposite to that of an electrode are excited on an insulator provided on the chuck's surface to cause a dielectric polarization phenomenon to occur, so that an electrostatic force is applied to an object to be attracted.

The attracting force F of the electrostatic chuck is represented by the following expression:

$$F = S/2 \times \in \times (V/d)^2,$$

where S is the area of the electrode of the electrostatic chuck, $\in$ is the dielectric constant of the insulator, V is the applied voltage, and d is the thickness of the insulator on the surface. The above-described expression may be modified in accordance with various conditions.

In a bipolar electrostatic chuck which is easy to handle and in which an object to be attracted need not be grounded, the attracting force is less than half the value of the above-described electrostatic chuck (unipolar type). For example, when using high-purity $Al_2O_3$, which is little contaminated with metal, for the insulator on the surface, the attracting force is about 25 g/cm².

If the pattern region of the reflection mask is 200 mm square with a thickness of a few μm, and the base is 210 mm square with a thickness of 10 mm and is made of Si, the mass of the reflection mask is about 1 Kg.

If a time period of 0.5 sec is required for exposure of one shot, it is necessary to scan a distance of 200 mm in a time period equal to or less than 0.5 sec. Hence, if a scanning speed of 400 mm/sec is obtained within 0.05 sec, the maximum acceleration of the mask stage is 8 m/sec².

When the mask is supported in a direction parallel to the direction of gravity, the maximum acceleration applied to the mask after adding the acceleration due to gravity is about 18 m/sec², i.e., the force applied to the mask in the scanning direction is 18 N.

Since the attracting force of the electrostatic chuck is 21×21×0.025×9.8 =100 N, the coefficient of friction must be equal to or greater than 0.18 N in order to prevent the reflection mask from dropping.

In general, the surface of the electrostatic chuck is very precisely processed to an excellent flatness, and therefore has a low coefficient of friction. Hence, the mask may drop in the worst case. Accordingly, in the present invention, the attracting force of the mask by the electrostatic chuck is changed-in accordance with a situation in order to prevent the mask from dropping. A specific configuration for that purpose will now be described.

First Embodiment

Figure 1:
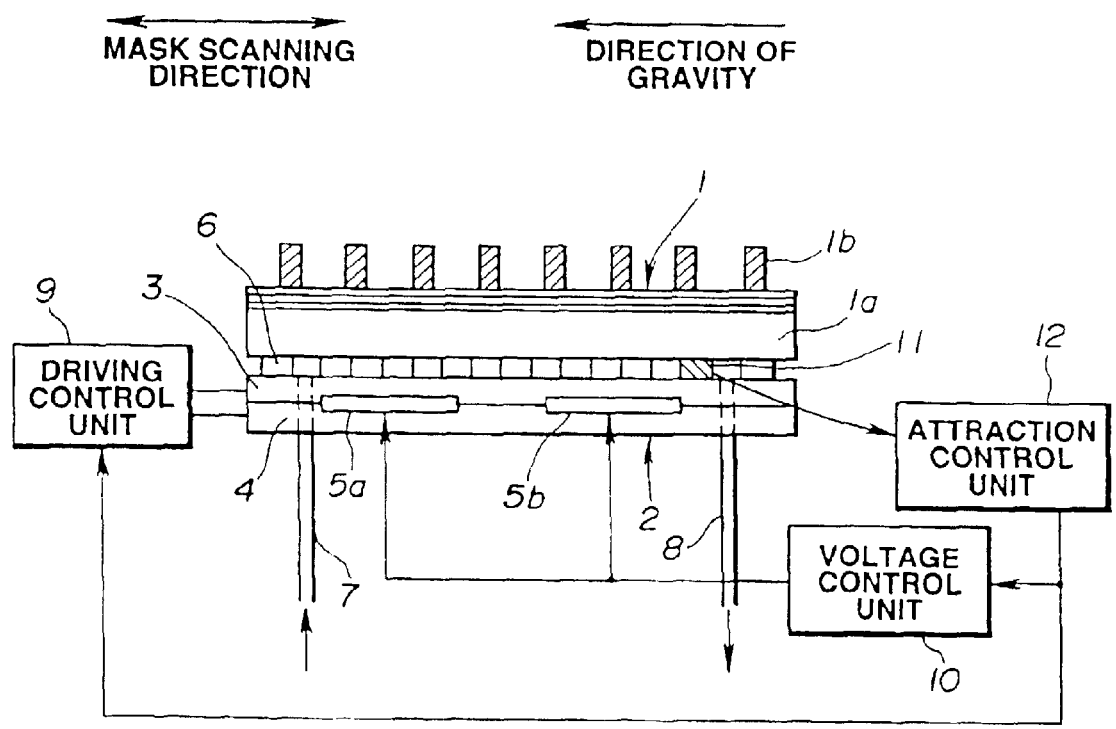
FIG. 1 is a cross-sectional view as seen from a side illustrating the configuration of a mask supporting device according to a first embodiment of the present invention.

FIG. 1 is a cross-sectional view as seen from the side, illustrating the configuration of a mask supporting device, which is used in a mask stage of an X-ray projection exposure apparatus, according to a first embodiment of the present invention.

In FIG. 1, a reflection X-ray mask 1, serving as an optical element, comprises a base 1a comprising an Si substrate, and a pattern region 1b. The pattern region 1b is formed on the base 1a according to a thin-film forming method, such as magnetron sputtering, or the like.

The pattern region 1b comprises a region having a low reflectivity for X-rays, such as vacuum-ultraviolet rays or soft X-rays, and a pattern portion having a high reflectivity for the X-rays. The pattern portion comprises an X-ray absorbing member (for example, made of gold or tungsten) formed on a patterned X-ray reflecting multilayer film obtained by alternately laminating at least two kinds of substances having different refractive indices for vacuum-ultraviolet rays or soft X-rays.

The mask supporting device for holding the mask 1 comprises an electrostatic chuck 2 for attracting the mask 1, a plurality of pin-shaped projections 6 formed on portions thereof, a pressure sensor (attracting-force detection means) 11 for detecting an attracting force for the mask 1, an attraction control unit 12 for calculating the attracting force from the result of detection of the pressure sensor 11, a voltage control unit 10 for outputting a voltage for controlling the attracting force from the attracting force calculated by the attraction control unit 12, and a driving control unit 9 for effecting scanning movement of the mask 1. A supply tube 7 for supplying voids formed between the projections 6 with a cooling gas (such as helium or the like), and a recovering tube 8 for recovering the gas introduced into the voids are also provided.

The electrostatic chuck 2 comprises a first insulating layer 3 and a second insulating layer 4. A first electrode 5a and a second electrode 5b for generating the attracting force are formed between the first insulating layer 3 and the second insulating layer 4, and the pin-shaped projections 6 are formed on the first insulating layer 3.

In this configuration, when a voltage is applied from the voltage control unit 10 to the first electrode 5a and the second electrode 5b of the electrostatic chuck 2, static electricity is generated and charges having a sign different from that of the voltage are excited on the surface of the first insulating layer 3. At that time, the dielectric polarization phenomenon appears on the surface of the first insulating layer 3, and an electrostatic force is applied to the mask 1. The mask 1 is thereby attracted and fixed by being supported on the pin-shaped projections 6 formed on the electrostatic chuck 2.

Since a so-called pin-chuck shape is provided in the above-described manner and the ratio of the area of portions of the distal ends of the pin-shaped projections 6 contacting the back of the mask 1 to the entire area of the mask 1 is arranged to be equal to or less than 10% (more preferably, <2%), the deformation of the mask 1 due to the presence of dust between the mask 1 and the electrostatic chuck 2 is prevented. In addition, since cooling gas flows in the voids between the projections 6, the mask 1, placed in a vacuum in which cooling is difficult to perform, is effectively cooled from the back to suppress the distortion of the mask pattern.

The pressure sensor 11 for detecting the attracting force for the mask 1 is disposed on the surface of the electrostatic chuck 2, and the attracting force for the mask 1 is calculated by the attraction control unit 12 from a detection signal from the pressure sensor 11.

In order to increase the illuminating region for the mask 1, the electrostatic chuck 2 is subjected to scanning movement by the control of the driving control unit 9.

The attraction control unit 12 calculates the acceleration of the electrostatic chuck 2 from position information relating to the electrostatic chuck 2 detected by the driving control unit 9, and transmits an instruction to the voltage control unit 10 so that the following relationship is satisfied:

{(the mass of the mask)×(acceleration due to gravity+the maximum acceleration of the mask while being moved)/(the maximum coefficient of static friction between the mask and the mask chuck)}×(safety factor)<the attracting force  (1), wherein (the attracting force) is defined by: (the generating electrostatic force)−(the differential pressure between the pressure of the cooling gas and the atmosphere pressure of the inside of the entire apparatus).

The voltage control unit 10 controls the attracting force by changing the voltage applied to the first electrode 5a and the second electrode 5b in accordance with the instruction from the attraction control unit 12.

Expression (1) may be satisfied by controlling the attracting force to be constant and controlling the acceleration instead of the attracting force by providing an instruction from the attraction control unit 12 to the driving control unit 9.

According to the above-described configuration, the drop of the mask 1 from the electrostatic mask 2 is prevented.

Second Embodiment

Figure 2A:
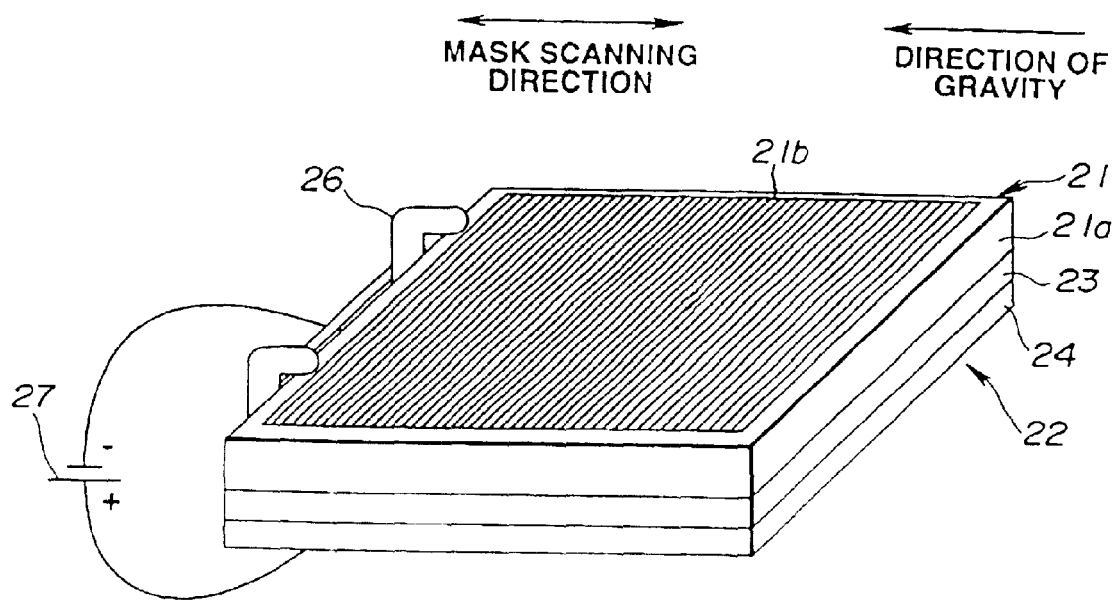
FIGS. 2(a) and 2(b) are diagrams illustrating the configuration of a mask supporting device according to a second embodiment of the present invention.
Figure 2B:
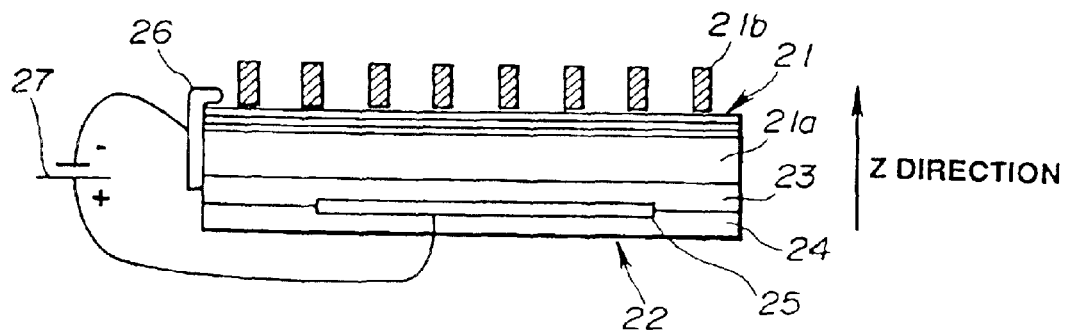

FIGS. 2(a) and 2(b) are diagrams illustrating the configuration of a mask supporting device according to a second embodiment of the present invention: FIG. 2(a) is a perspective view; and FIG. 2(b) is a cross-sectional view as seen from the side.

In the mask supporting device of the first embodiment, a bipolar electrostatic chuck is used. In the mask supporting device of the second embodiment, a unipolar electrostatic chuck having a strong attracting force is used. By using such a unipolar electrostatic chuck, reliability in the attraction of the mask is improved. The second embodiment has the same structure as the first embodiment, except as noted below. In FIGS. 2(a) and 2(b), only the configuration of components added in the second embodiment which are not found in the first embodiment, is illustrated, and the attraction control unit, the voltage control unit and the driving control unit shown in the first embodiment are not illustrated. Since the operations of these units are the same as in the first embodiment, a description thereof will be omitted.

When attracting a mask on the unipolar electrostatic chuck, the mask must be grounded. However, since the mask is conveyed within the exposure apparatus and is mounted on and detachable from the electrostatic chuck, it is difficult to always ground the mask. Accordingly, in the mask supporting device of the second embodiment, the mask is grounded only when it is attracted on the electrostatic chuck so as not to hinder the conveyance of the mask.

In FIGS. 2(a) and 2(b), a mask 21 comprises a base 2a comprising an Si substrate, and a pattern region 2b which is formed on the base 2a.

The mask supporting device for attracting and holding the mask 21 comprises an electrostatic chuck 22 for attracting the mask 21, and an earth pawl 26 for grounding the mask 21.

The electrostatic chuck 22 comprises a first insulating layer 23 and a second insulating layer 24, and an electrode 25, for generating an attracting force, is formed between the first insulating layer 23 and the second insulating layer 24. The earth pawl 26 is connected to a minus (−) terminal of a power supply 27, and a plus (+) terminal of the power supply 27 is connected to the electrode 25.

In this configuration, when the plus (+) potential of the power supply 27 is applied to the electrode 25 of the electrostatic chuck 22, charges of a different sign are excited on the surface of the first insulating layer 23. At that time, the dielectric polarization phenomenon appears on the surface of the first insulating layer 23, and an electrostatic force is applied to the mask 21. The mask 21 is thereby attracted and fixed to the electrostatic chuck 22.

The earth pawl 26 is fixed relative to the electrostatic chuck 22 so as to be movable in the z direction shown in FIG. 2(b) to contact the base 2a of the mask 21, so that the mask 21 can be grounded and masks having different thicknesses can be attracted. By disposing the earth pawl 26 at a side of the base 2a, the earth pawl 26 also has the function of preventing the mask 21 from dropping.

An object which can be attracted by the electrostatic chuck 22 is a conductor or a semiconductor. When attracting a mask 21 having a base 2a made of an insulator, the mask 21 is attracted by forming a conductive layer of a metal on the back and the sides of the mask 21 by vacuum deposition or the like and contacting the conductive layer to the earth pawl 26.

According to the above-described configuration, a unipolar electrostatic chuck having a strong attracting force can be used for the mask supporting device, and reliability in the attraction of the mask can be improved. Since a sufficient attracting force can be obtained even with a material having a relatively low dielectric constant, a material with low metal contamination can be adopted. When semiconductor devices are manufactured using an exposure apparatus including the mask supporting device of the second embodiment, the production yield of the devices can be increased.

Furthermore, since masks having different thicknesses can be attracted, the tolerances in the thickness of the mask required in the manufacture of the mask can be increased. Hence, the cost in the manufacture of the mask can be reduced.

Since the earth pawl 26 also has the function of preventing the mask 21 from dropping, reliability in the attraction of the mask is improved.

In addition, since a grounding mechanism which does not hinder the conveyance of the mask 21 is adopted, reliability in the conveyance of the mask is also improved.

Third Embodiment

Figure 3:
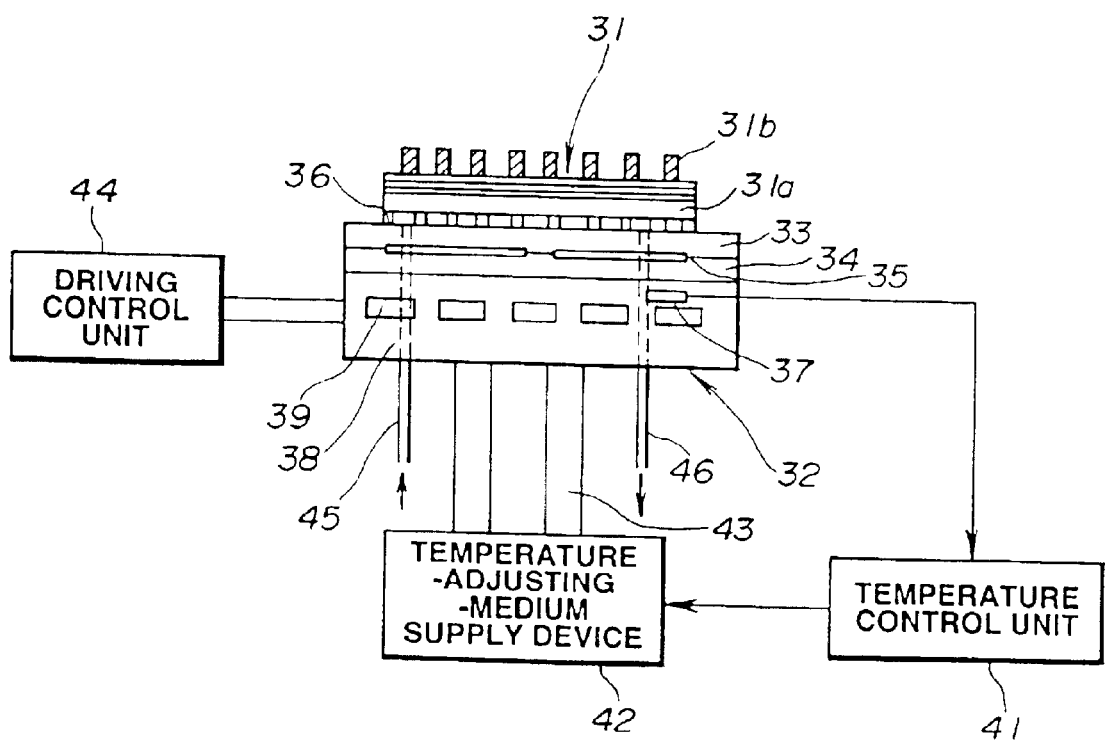
FIG. 3 is a cross-sectional view as seen from a side illustrating the configuration of a mask supporting device according to a third embodiment of the present invention.

FIG. 3 is a cross-sectional view as seen from a side illustrating the configuration of a mask supporting device according to a third embodiment of the present invention.

The mask supporting device of the third embodiment includes temperature control means for controlling an electrostatic chuck to be a desired temperature. The third embodiment has the same structure as the first embodiment, except as noted below. In FIG. 3, only the configuration of components added in the third embodiment, which are not found in the first embodiment, is illustrated, and the attraction control unit and the voltage control unit shown in the first embodiment are not illustrated. Since the operations of these units are the same as in the first embodiment, a description thereof will be omitted.

In FIG. 3, a mask 31 comprises a base 31a comprising a Si substrate, and a pattern region 31b which is formed on the base 31a.

The mask supporting device for attracting and holding the mask 31 comprises an electrostatic chuck 32 for attracting the mask 31, a chuck base 38 having a low coefficient of linear expansion and high stiffness on which the electrostatic chuck 32 is fixed, a temperature sensor 37 for detecting the temperature of the chuck base 38, a temperature-adjusting-medium supply device 42 containing a temperature-adjusting or controlled medium for changing the temperature of the chuck base 38 by changing the temperature of the temperature adjusting or controlled medium, a temperature control unit 41 for controlling the temperature-adjusting-medium supply device 42 based on a detection signal from the temperature sensor 37, and a driving control unit 44 for effecting scanning movement of the electrostatic chuck 32.

The electrostatic chuck 32 comprises a first insulating layer 33 and a second insulating layer 34. An electrode 35 for generating an attracting force is formed between the first insulating layer 33 and the second insulating layer 34. A plurality of pin-shaped projections 36 are formed on the surface of the first insulating layer 33. In addition, a supply tube 45 for supplying voids formed between projections 36 with a cooling gas, and a recovering tube 46 for recovering the gas introduced into the voids are provided.

In this configuration, when a voltage is applied from a voltage control unit (not shown) to the electrode 35 of the electrostatic chuck 32, charges having a sign different from that of the voltage are excited on the surface of the first insulating layer 33. At that time, the dielectric polarization phenomenon appears on the surface of the first insulating layer 33, and an electrostatic force is applied to the mask 31. The mask 31 is thereby attracted and fixed on the pin-shaped projections 36 formed on the electrostatic chuck 32.

The temperature sensor 37 comprises, for example, a platinum resistance temperature sensor, and has a resolution of about 0.01° C. By being directly buried at a sufficiently deep position in the chuck base 38, the temperature sensor 37 can very precisely detect the temperature of the chuck base 38.

A channel 39 is provided in the chuck base 38 in order to receive a temperature-adjusting or controlled medium subjected to temperature control. The temperature-adjusting or controlled medium is supplied from the temperature-adjusting-medium supply device 42 via flexible tubes 43 made of a metal or Teflon which has a low gas discharge rate in a vacuum. The chuck base 38 comprises, for example, a ceramic material, such as SiC, SiN or the like, or low-thermal-expansion glass, in which thermal strain is very small due to a low coefficient of linear expansion.

The temperature control unit 41 controls the temperature-adjusting-medium supply device 42 based on an output signal from the temperature sensor 37 in order to control the temperature of the temperature-adjusting or controlled medium to be supplied to the chuck base 38.

The electrostatic chuck 32 generates a sufficient force to attract the mask 31, and prevents the thermal expansion of the mask 31, having absorbed exposure light in lateral directions, by the attracting force×the coefficient of friction of the electrostatic chuck 32. In order to prevent position deviation in lateral directions due to thermal expansion, the temperature of the electrostatic chuck 32 is very precisely controlled. More specifically, variations in the temperature of the electrostatic chuck 32 are very precisely controlled within a range equal to or less than 0.01° C.

In general, in an exposure apparatus, exposure is performed after very precisely aligning a mask with a wafer. In order to precisely perform the alignment, as disclosed in Japanese Patent Laid-Open Application (Kokai) No. 2-100311 (1990), a fine movement mechanism using a displacement member, comprising an elastic member having a low stiffness, such as a leaf spring or the like, and an actuator, comprising a piezoelectric element, are required for a mechanism for driving the wafer or the mask.

The fine movement mechanism vibrates when the temperature adjusting medium flows because of its low stiffness, thereby degrading accuracy in the line width of the transferred pattern. In order to solve such a problem, the mask supporting device of the third embodiment uses only a coarse movement mechanism having a high stiffness for the driving mechanism, and a fine movement mechanism is provided in a mechanism for driving the wafer. The device also includes means for measuring the amount of shift of the interval between patterns on the exposed wafer, and expanding or contracting the electrostatic chuck by changing the temperature of the electrostatic chuck so as to minimize the amount of the shift.

When the electrostatic chuck 32 is expanded or contracted, since the mask 31, attracted and constrained thereon, is simultaneously expanded or contracted, it is possible to correct the position deviation of the pattern of the mask 31. The temperature of the electrostatic chuck 32 is corrected by measuring, in advance, the relationship between the amount of shift of the pattern of the wafer after exposure and the change in the temperature of the electrostatic chuck 32, and by controlling the temperature of the electrostatic chuck 32 by the temperature control unit 41 so as to minimize the amount of shift of the interval between patterns on the wafer based on the obtained data.

The amount of shift of the interval between patterns on the wafer may be obtained from a signal from alignment adjusting means (not shown) for performing alignment between the mask and the wafer, instead of measuring the interval between exposed patterns.

Instead of using a temperature adjusting medium, the temperature of the electrostatic chuck 32 may be adjusted by precisely controlling the temperature at a high speed using, for example, a Peltier-effect element as disclosed in Japanese Patent Laid-Open Application (Kokai) No. 5-21308 (1993).

Embodiment of Device Manufacturing Method

Figure 5:
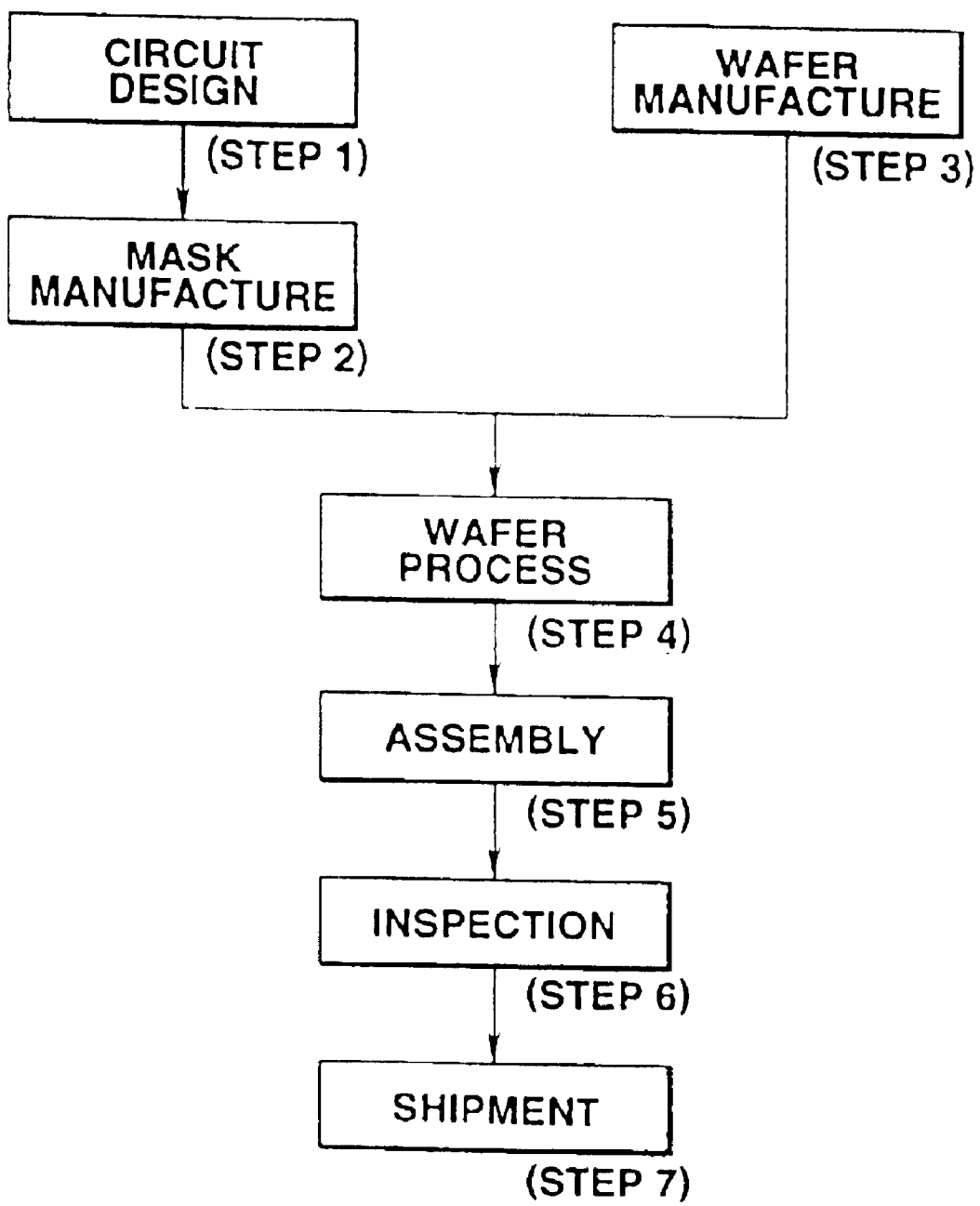
FIG. 5 is a flowchart illustrating the method of device manufacture of the present invention.

FIG. 5 is a flow chart of a method for manufacturing semiconductor devices (semiconductor chips of ICs (integrated circuits), LSIs (large-scale integrated circuits) or the like, liquid-crystal panels, CCDs (charge-coupled devices) or the like) using the above-described X-ray projection exposure apparatus. In step 1 (circuit design), circuit design of semiconductor devices is performed. In step 2 (mask manufacture), masks, on which designed circuit patterns are formed, are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. Step 5 (assembly) is called a postprocess which manufactures semiconductor chips using the wafers manufactured in step 4, and includes an assembling process (dicing and bonding), a packaging process (chip encapsulation), and the like. In step 6, (inspection), inspection operations, such as operation-confirming tests, durability tests, and the like, of the semiconductor devices manufactured in step 5 are performed. The manufacture of semiconductor devices is completed after passing through the above-described processes, and the manufactured devices are shipped (step 7).

Figure 6:
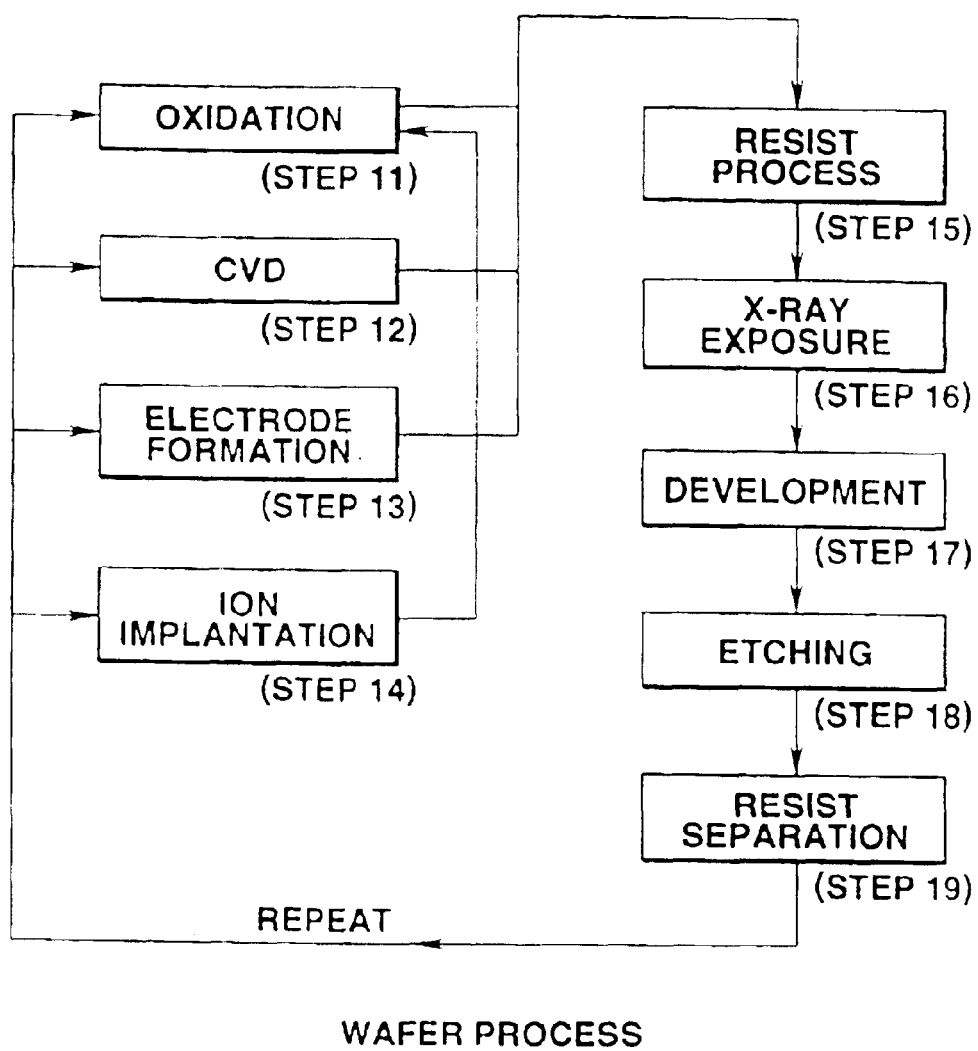
FIG. 6 is a flowchart illustrating the method of a wafer process of the present invention.

FIG. 6 is a detailed flow diagram of the above-described wafer process (step 4). In step 11 (oxidation), the surface of the wafer is oxidized. In step 12 (CVD (chemical vapor deposition)), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer using the above-described X-ray projection exposure apparatus. In step 17 (development), the exposed wafer is developed. In step 18 (etching), portions other than the developed resist image are etched off. In step 19 (resist separation), the resist, which becomes unnecessary after the completion of the etching, is removed. By repeating these steps, a final circuit pattern made of multiple patterns is formed on the wafer.

The individual components shown in outline or designated by blocks in the drawings are all well known in the X-ray projection exposure apparatus and device manufacturing method arts and their specific construction and operation are not critical to the operation or the best mode for carrying out the invention.

While the present invention has been described with respect to what are presently considered to be preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:

a chuck for holding an object; and an optical system for directing light from a light source to the object held by said chuck, said optical system including a multilayer film mirror which has a concave reflecting surface, wherein an area of contacting portions of said chuck is set so that the contacting portions area of the chuck is at most 10% of an area of the object held by said chuck.

2. An exposure apparatus according to claim 1, wherein the area of contacting portions of said chuck is set so that the contacting portions area of the chuck is at most 2% of the area of the object held by said chuck.

3. A device manufacturing method using an exposure apparatus that includes (i) a chuck for holding an object, and (ii) an optical system for directing light from a light surface to the object held by said chuck, said optical system including a multilayer film mirror which has a concave reflecting surface, wherein an area of contacting portions of said chuck is set so that the contacting portions area of the chuck is at most 10% of an area of the object hold by said chuck, said method comprising the steps of:

holding the object by the chuck; and directing the light to the object using the optical system.

4. An exposure apparatus comprising:

an illumination system for illuminating a reflection mask with light from a light source, said illumination system including a multilayer film mirror which has a concave reflecting surface;

a projection optical system for projecting a pattern of the reflection mask onto an object; and a mask chuck for holding the reflection mask, wherein an area of contacting portions of said mask chuck is set so that the contacting portions area of the mask chuck is at most 10% of an area of the reflection mask held by said mask chuck.

5. An exposure apparatus according to claim 4, wherein the area of contacting portions of said mask chuck is set so that the contacting portions area of the mask chuck is at most 10% of the area of the reflection mask held by said mask chuck.

6. A device manufacturing method comprising the steps of:

exposing an object using an exposure apparatus; and developing the object that has been exposed, wherein the exposure apparatus includes:

an illumination system for illuminating a reflection mask with light from a light source, said illumination system including a multilayer film mirror which has a concave reflecting surface;

a projection optical system for projecting a pattern of the reflection mask onto the object; and a mask chuck for holding the reflection mask, wherein an area of contacting portions of the mask chuck is set so that the contacting portions area of the mask chuck is at most 10% of an area of the reflection mask held by the mask chuck.

* * * * *

UNITED STATES PATENT AND TRADEMARK OFFICE
CERTIFICATE OF CORRECTION

PATENT NO. : 6,836,531 B2
DATED : December 28, 2004
INVENTOR(S) : Shinichi Hara et al.

It is certified that error appears in the above-identified patent and that said Letters Patent is hereby corrected as shown below:

Title page,
Item [30], Foreign Application Priority Data,
"Mar. 12, 1996    (JP) ........................... 7/054636
 Feb. 18, 1997    (JP) ........................... 8/033869" should read as follows:
-- Mar. 12, 1996   (JP) ........................... 8-054636
   Feb. 18, 1997   (JP) ........................... 9-033869 --.

Column 1,
Line 25, "projection" should read -- projection exposure --.
Line 45, "0.1 um." should read -- 0.1 $\mu$m. --.

Column 4,
Line 54, "changed-in" should read -- changed in --.

Column 6,
Line 47, "region 2b" should read -- region 21b --.
Line 48, "base 2a." should read -- base 21a. --.

Column 7,
Line 3, "base 2a" should read -- base 21a --.
Line 5, "base 2a," should read -- base 21a, --.
Line 9, "base 2a" should read -- base 21a --.
Line 51, "comprising a" should read -- comprising an --.

Column 10,
Line 45, "hold" should read -- held --.

Signed and Sealed this

Twenty-fourth Day of May, 2005

JON W. DUDAS
*Director of the United States Patent and Trademark Office*